United States Patent
Chen

(10) Patent No.: US 12,461,456 B2
(45) Date of Patent: Nov. 4, 2025

(54) METHOD AND STRUCTURE FOR OVERLAY MEASUREMENT IN SEMICONDUCTOR DEVICE MANUFACTURING

(71) Applicant: TAIWAN SEMICONDUCTOR MANUFACTURING COMPANY, LTD., Hsinchu (TW)

(72) Inventor: Yen-Liang Chen, Zhubei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 781 days.

(21) Appl. No.: 17/587,757

(22) Filed: Jan. 28, 2022

(65) Prior Publication Data

US 2023/0244139 A1 Aug. 3, 2023

(51) Int. Cl.
G03F 9/00 (2006.01)
G03F 7/00 (2006.01)

(52) U.S. Cl.
CPC ........ G03F 9/7049 (2013.01); G03F 7/70633 (2013.01); G03F 7/70683 (2013.01)

(58) Field of Classification Search
None
See application file for complete search history.

(56) References Cited

U.S. PATENT DOCUMENTS

| | | | |
|---|---|---|---|
| 6,064,685 A * | 5/2000 | Bissessur | G02B 6/12007 372/20 |
| 6,150,231 A | 11/2000 | Muller | |
| 9,182,219 B1 | 11/2015 | Manassen et al. | |
| 10,795,268 B2 | 10/2020 | Chen | |
| 2002/0158193 A1* | 10/2002 | Sezginer | H01L 22/34 250/237 G |
| 2006/0050283 A1 | 3/2006 | Hill | |
| 2010/0005442 A1* | 1/2010 | Ghinovker | G06F 30/39 716/55 |
| 2011/0073775 A1* | 3/2011 | Setija | G03F 7/70633 250/492.1 |
| 2012/0133938 A1* | 5/2012 | Deckers | G03F 9/7076 356/388 |
| 2016/0300767 A1* | 10/2016 | Ko | G01B 11/27 |
| 2021/0026238 A1* | 1/2021 | Xiao | G03F 7/70633 |

(Continued)

FOREIGN PATENT DOCUMENTS

| | | | |
|---|---|---|---|
| CN | 1239322 A | 12/1999 | |
| CN | 102789997 A * | 11/2012 | ......... G01N 23/2251 |

(Continued)

*Primary Examiner* — Martin J Angebranndt
(74) *Attorney, Agent, or Firm* — Studebaker Brackett PLLC

(57) ABSTRACT

According to an aspect of the present disclosure, in a method of manufacturing a semiconductor device, a lower layer pattern including first periodic patterns having a first pitch is formed, and an upper layer pattern including second periodic patterns having a second pitch different from the first pitch is formed. The first periodic patterns at least partially overlaps the second periodic patterns in plan view. A Moiré fringe pattern of the lower layer pattern and the upper layer pattern is obtained by using an electron beam, and an overlay error between the lower layer pattern and the upper layer pattern is obtained from the Moiré fringe pattern.

20 Claims, 8 Drawing Sheets

(56) References Cited

U.S. PATENT DOCUMENTS

| | | | |
|---|---|---|---|
| 2021/0055660 A1* | 2/2021 | Polyakov | G03F 7/7085 |
| 2024/0085804 A1 | 3/2024 | Hsieh et al. | |

FOREIGN PATENT DOCUMENTS

| | | | | |
|---|---|---|---|---|
| JP | 10214765 A | * | 8/1998 | |
| JP | 2000019316 A | * | 1/2000 | |
| JP | 2005207802 A | * | 8/2005 | |
| KR | 20150121275 A | * | 10/2015 | |
| KR | 2020118908 A | * | 10/2020 | G01B 15/00 |
| TW | 200612212 A | | 4/2006 | |
| TW | 201915599 A | | 4/2019 | |
| TW | 202201139 A | | 1/2022 | |
| WO | WO-2014074873 A1 | * | 5/2014 | G03F 7/70633 |

\* cited by examiner

METHOD AND STRUCTURE FOR OVERLAY MEASUREMENT IN SEMICONDUCTOR DEVICE MANUFACTURING

BACKGROUND

As the semiconductor industry in pursuit of higher device density, has progressed into nanometer technology process nodes, reducing overlay errors between two layers (e.g., a photo resist layout pattern and an underlying layout pattern) in a lithography operation has become one of the important issues. Therefore, an efficient method of precisely determining an overlay error between overlay measurement patterns between two layers is desirable.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 1A is a cross sectional view and FIGS. 1B and 1C are plan views viewed from above (layout views).

DETAILED DESCRIPTION

Figure 1A:
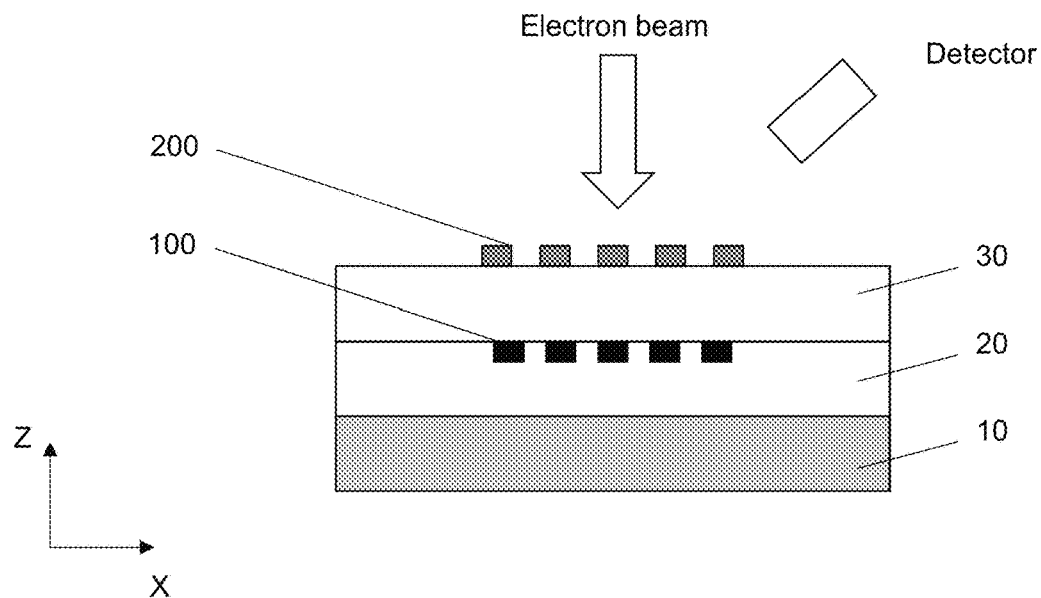
FIGS. 1A, 1B and 1C show various views of a structure of an overlay measurement pattern set according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "being made of" may mean either "comprising" or "consisting of." In the present disclosure, a phrase "one of A, B and C" means "A, B and/or C" (A, B, C, A and B, A and C, B and C, or A, B and C), and does not mean one element from A, one element from B and one element from C, unless otherwise described.

During an integrated circuit (IC) design, a number of layout patterns of the IC, for different steps of IC processing, are generated. The layout patterns include geometric shapes corresponding to structures to be fabricated on a wafer. The layout patterns may be photo mask layout patterns that are projected, e.g., imaged, on the wafer to create the IC. A lithography process transfers a layout pattern of a photo mask to the wafer such that etching, implantation, or other steps are applied only to predefined regions of the wafer. Multiple layout patterns may be transferred to different layers of the wafer to create the different structures on the wafer. Thus, a second or subsequent layout pattern may be transferred to a second layer on the wafer when a first or previous layout pattern exists in a different first layer of the wafer beneath the second layer.

As described, multiple layout patterns may be transferred to different layers of the wafer to create the different structures on the wafer. It is desirable that there is no overlay error between the layout patterns that are produced on a wafer. In some embodiments, an overlay measurement pattern, e.g., a grating pattern, is included in each layout pattern. The overlay measurement pattern, which may not be part of the functional IC circuit, is used for determining the overlay error between different pattern layers that are disposed on the wafer.

Generally, the overlapped overlay measurement patterns of the two layout patterns are irradiated with a beam of light, e.g., a coherent beam of light. However, due to a resolution limit of the optical irradiation, an electron beam based measurement has been developed.

Figure 1B:
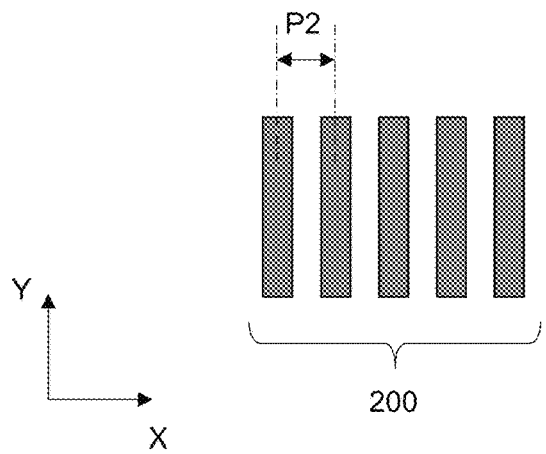
Figure 1C:
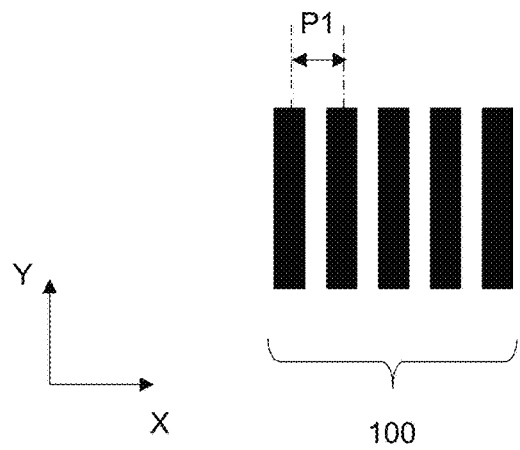

FIGS. 1A-1C show various views of the structure of an overlay measurement pattern set according to an embodiment of the present disclosure. FIG. 1A is a cross sectional view and FIGS. 1B and 1C are plan views viewed from above (layout views).

The overlay measurement pattern set includes a lower layer pattern 100 and an upper layer 200 formed over the lower layer pattern 100. In some embodiments, the lower layer pattern 100 is formed on or in the surface of a first intermediate layer 20 disposed over a substrate 10, and the upper layer pattern 200 is formed on or in a second intermediate layer 30, as shown in FIG. 1A. In other embodiments, the lower layer pattern 100 is formed on or in the surface of the substrate 10. The upper layer pattern 200 at least partially overlaps the lower layer pattern 100.

The substrate 10 is, for example, a p-type silicon substrate with an impurity concentration in a range from about $1\times10^{15}$ cm$^{-3}$ to about $1\times10^{18}$ cm$^{-3}$. In other embodiments, the substrate is an n-type silicon substrate with an impurity concentration in a range from about 1×10¹⁵ cm⁻³ to about 1×10¹⁸ cm⁻³. Alternatively, the substrate may comprise another elementary semiconductor, such as germanium; a compound semiconductor including Group IV-IV compound semiconductors, such as SiC and SiGe; Group III-V compound semiconductors, such as GaAs, GaP, GaN, InP, InAs, InSb, GaAsP, AlGaN, AlInAs, AlGaAs, GaInAs, GaInP, and/or GaInAsP; or combinations thereof. In one embodiment, the substrate is a silicon layer of an SOI (silicon-on-insulator) substrate.

In some embodiments, each of the first intermediate layer 20 and the second intermediate layer 30 includes one or more dielectric layers formed by, for example, chemical vapor deposition (CVD), physical vapor deposition (PVD), or atomic layer deposition (ALD) or any other suitable film formation methods. Each of the first dielectric layer 20 and the second dielectric layer 30 includes one or more of silicon oxide, silicon nitride, SiON, SiOCN, SiCN, SiOC, aluminum oxide, hafnium oxide or any other suitable dielectric material. In other embodiments, the first and/or second intermediate layers are made of a conductive or a semiconductive material.

In some embodiments, one or more conductive layers or patterns are formed between the substrate 10 and the lower layer pattern 100.

In some embodiments, each of the lower layer pattern 100 and the upper layer pattern 200 is made of a conductive material, such as a semiconductor material (e.g., crystalline, poly-crystalline or amorphous Si, SiGe or Ge), a metal (e.g., Cu, Al, Ti, Ta, Co, Ru, W, etc.) and a metal compound (e.g., TiN, TaN. WN, TiAl, TiAlC, silicide, etc.). In some embodiments, at least one of the lower layer pattern 100 or the upper layer pattern 200 is made of a dielectric material. In some embodiments, the upper layer pattern 200 is made of an organic material, such as photo resist.

As shown in FIGS. 1B and 1C, the lower layer pattern 100 and the upper layer pattern 200 include periodic patterns, such as line and space patterns. In some embodiments, the lower layer pattern 100 includes a first periodic pattern having a pitch P1, and the upper layer pattern 200 includes a second periodic pattern having a pitch P2, where P1 is different from P2. In some embodiments, P1>P2 and in other embodiments, P1<P2. In some embodiments, a difference between the first pitch P1 and the second pitch P2 is in a range from about 1 nm to about 20 nm and is in a range from about 2 nm to about 10 nm in other embodiments, to obtain a sufficient Moiré fringe pattern. In some embodiments, each of the first pitch P1 and the second pitch P2 is in a range from about 20 nm to about 200 nm, and is in a range from about 50 nm to about 100 nm in other embodiments. In some embodiments, a width (dimension along the X direction in FIGS. 1B and 1C) of each of the first periodic patterns of the lower layer pattern 100 and each of the second periodic patterns of the upper layer patterns 200 is in a range from about 10 nm to about 200 nm, and is in a range from about 50 nm to about 100 nm in other embodiments. In some embodiments, a ratio between the width W of the line pattern and the space S between adjacent line patterns of the first and second periodic patterns (S/W) is in a range from about 0.8 to about 10, and is in a range from about 1.5 to about 3 in other embodiments. In some embodiments, a length (dimension along the Y direction in FIGS. 1B and 1C) of each of the first periodic patterns of the lower layer pattern 100 is different from a length of each of the second periodic patterns of the upper layer pattern 200. In some embodiments, the number of the first periodic patterns is the same as the number of the second periodic patterns. In some embodiments, the number of the first and/or second periodic patterns is in a range from about 5 to about 20.

When the dimensions of the first periodic patterns of the lower layer pattern 100 and the second periodic patterns of the upper layer pattern 200 are out of the aforementioned ranges, a sufficient Moiré fringe pattern described below may not be obtained.

In some embodiments, in a pattern layout design, the center of the upper layer pattern 200 is located at the same position as the center of the lower layer pattern 100. For example, when the number of the first and second periodic patterns is an odd number, the center (line) pattern of the second periodic pattern is aligned with the center (line) pattern of the first periodic pattern, where there is no overlay error between the first layer pattern 100 and the second layer pattern 200. In other embodiments, the center of the upper layer pattern 200 is slightly shifted along the X direction with respect to the center of the lower layer pattern 100. The shift amount is greater than zero and less than the first pitch P1 or the second pitch P2.

In the present embodiments, the overlay measurement pattern set as shown in FIGS. 1A-1C is inspected or measured by using a scanning electron microscope (SEM). In some embodiments, the acceleration voltage of the SEM is adjusted such that the electron beam reaches the first layer pattern 100 through the second intermediate layer 30 and the upper layer pattern 200. In some embodiments, the acceleration voltage of the SEM is in a range from about 1 keV to about 10 keV depending on the layer structure. In some embodiments, an SEM apparatus includes a detector configured to detect both secondary electrons (SE) and back scattered electrons (BSE). In other embodiments, a SEM apparatus includes a secondary electron detector to detect secondary electrons and a back scattered electron detector to detect back scattered electrons. In the present disclosure, the secondary electrons are mainly generated from the upper layer pattern 200 and the back scattered electrons are mainly generated from the lower layer pattern 100.

When the upper layer pattern 200 and the lower layer 100 are irradiated with an electron beam of the SEM, the SEM image includes both the lower layer pattern image (previous layer pattern) and the upper layer image (current layer pattern). Since the first pitch P1 of the first periodic patterns of the lower layer pattern 100 is slightly different from the second pitch P2 of the second periodic patterns of the upper layer pattern 200, the SEM image includes a Moiré fringe pattern. The Moiré fringe pattern varies according to a phase difference between the lower layer pattern 100 and the upper layer pattern 200. The phase difference corresponds to the shift amount between the center of the upper layer pattern 200 and the center of the lower layer pattern 100.

When the lower layer pattern 100 has a pitch P1 and the upper layer pattern 200 has a pitch P2, the Moiré fringe pattern has a pitch $$\Lambda = \frac{P_1 \times P_2}{|P_1 - P_2|}.$$

Figure 2:
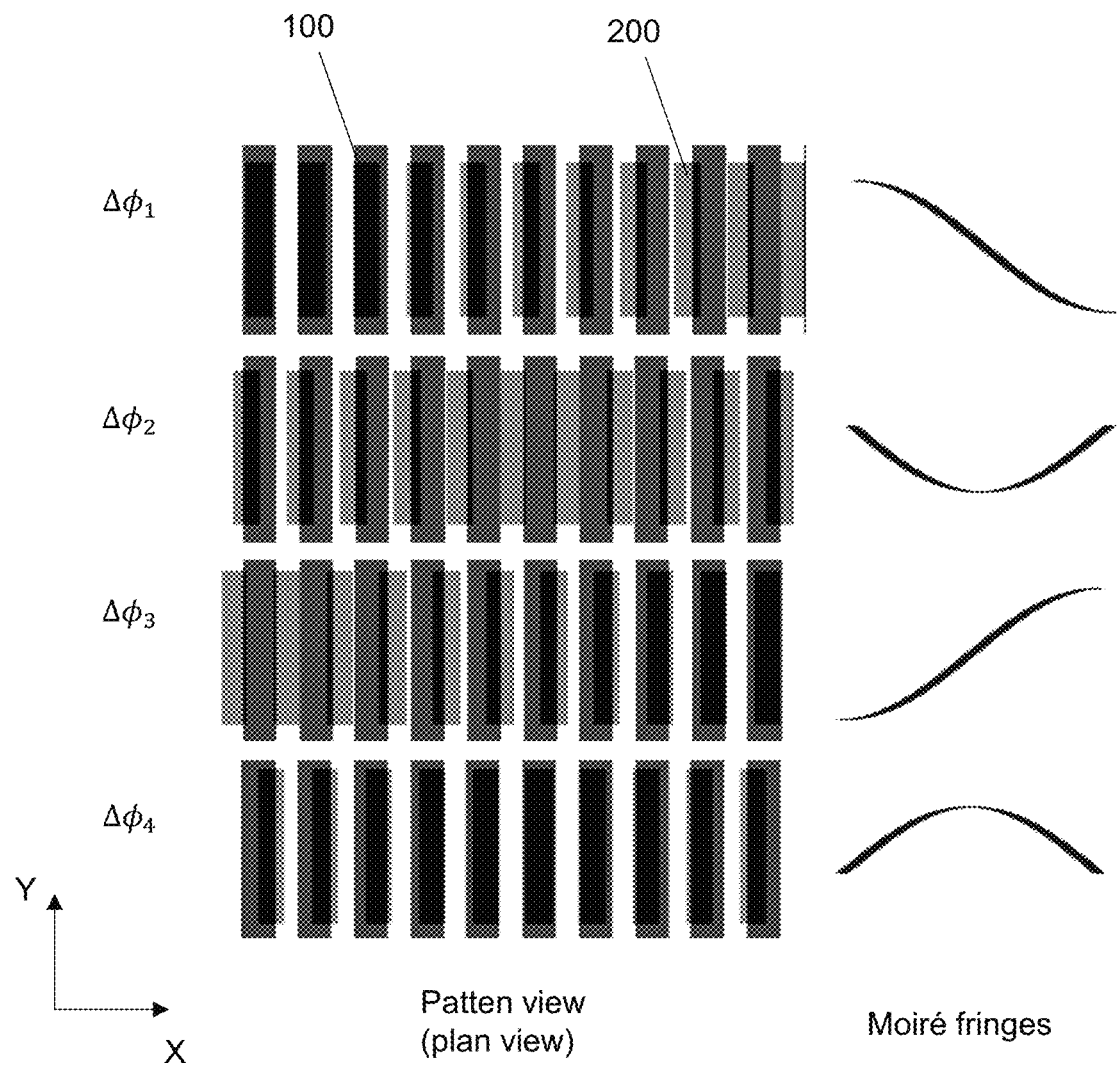
FIG. 2 shows Moiré fringe patterns with different phase shift amounts $\Delta\varphi_i$ according to an embodiment of the present disclosure.

FIG. 2 shows Moiré fringe patterns with different phase shift amounts $\Delta\varphi i$. As shown in FIG. 2 the Moiré fringe pattern shows a trigonometric function pattern, expressed by:

$$I_i = \cos\left(\frac{2\pi}{\Lambda}x + \frac{2\pi \cdot OVL}{P1} + \psi_0 + \Delta\phi_i\right)$$

where OVL is an overlay error between the upper layer pattern 200 and the lower layer pattern 100 caused by a manufacturing process, P1 is a pitch of the lower layer pattern 100, Λ is a Moiré fringe pattern pitch, $\psi_0$ is an initial phase, which is determined by the relative position of the pattern design (e.g., on the GDS layout) between the upper layer and the lower layer, and ΔΟ is a designed phase shift amount between the upper layer pattern 200 and the lower layer pattern 100. In some embodiments, a phase shift amount of π corresponds to P1/2, and in other embodiments, a phase shift amount of π corresponds to P2/2.

As shown in FIG. 2, in some embodiments, four measurement pattern sets with different phase shift amounts between the upper layer pattern 200 and the lower layer pattern 100 are provided over the substrate. In some embodiments, the difference in phase between one pattern set and the next pattern set is π/2, π/3, or π/4. In some embodiments, $\Delta\varphi_i = -3\pi/4, -\pi/4, \pi/4, 3\pi/4$ for $I_i = I_1, I_2, I_3, I_4$.

From the SEM image, four Moiré fringe patterns are obtained as shown in FIG. 2, and each of the Moiré fringe patterns is analyzed by a curve fitting method to obtain $I_i$ (where i=1, 2, 3, 4). Then, the overlay error OVL along the X direction can be calculated by:

$$OVL = \frac{P1}{2\pi}\left[\tan^{-1}\left(\sqrt{\frac{[3(I_2-I_3)-(I_1-I_4)][(I_2-I_3)+(I_1-I_4)]}{[(I_2+I_3)+(I_1+I_4)]^2}}\right) - \frac{2\pi}{\Lambda}x - \psi_0\right]$$

To measure the overlay error along the Y direction, the overlay measurement pattern set as shown in FIGS. 1A-2 rotated by 90 degrees is used.

Figure 3:
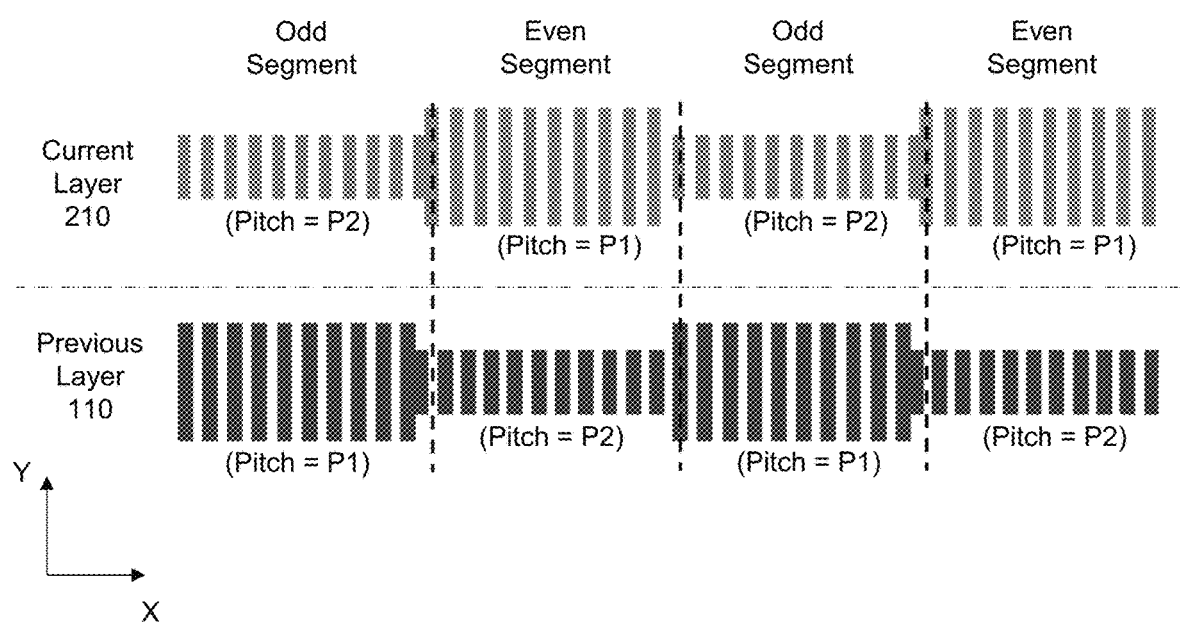
FIG. 3 shows an overlay measurement pattern set according to an embodiment of the present disclosure.

FIG. 3 shows an overlay measurement pattern set according to an embodiment of the present disclosure. Configurations, dimensions, methods, and material as explained with respect to FIGS. 1A-2 are applicable to the following embodiments, and the detailed description thereof may be omitted. FIG. 3 is a plan view of each of the upper (current) layer pattern 210 and the lower (previous) layer pattern 110.

In some embodiments, the lower layer pattern 110 includes N groups or segments of periodic patterns, where N is a natural number of 2 or more. The N groups of periodic patterns are arranged along the X direction for measuring the X directional overlay error as shown in FIG. 3. The N groups of periodic patterns rotated by 90 degrees are arranged along the Y direction for measuring the Y directional overlay error. In some embodiments, one or more odd number groups (e.g., 1, 3, . . . ) of the N groups of periodic patterns include first periodic patterns having a first pitch P1, and one or more even number groups (e.g., 2, 4, . . . ) of the N groups of periodic patterns include second periodic patterns having a second pitch P2.

In some embodiments, the upper layer pattern 210 includes N groups or segments of periodic patterns, where N is a natural number of 2 or more. The N groups of periodic patterns are arranged along the X direction for measuring the X directional overlay error as shown in FIG. 3. The N groups of periodic patterns rotated by 90 degrees are arranged along the Y direction for measuring the Y directional overlay error. In some embodiments, one or more odd number groups (e.g., 1, 3, . . . ) of the N groups of periodic patterns include third periodic patterns having the second pitch P2, and one or more even number groups (e.g., 2, 4, . . . ) of the N groups of periodic patterns include fourth periodic patterns having the first pitch P1.

The number of periodic patterns in each of the groups or segments and/or the number N of the groups or segments are determined such that the entire overlay measurement pattern set is within a field of view (FOV) of the SEM. However, a large FOV exhibits a lower resolution in an SEM image, which affects the quality of the Moiré fringe pattern, these numbers should be determined considering the pattern resolution of the SEM. In some embodiments, N is an even number and two or four, and the number of periodic patterns in each of the groups or segments is 5 to 20. In some embodiments, the length (along the Y direction in FIG. 3) of the periodic patterns having the first pitch P1 is different from the length of the periodic patterns having the second pitch P2.

In the overlay measurement set as shown in FIG. 3, the odd number groups of the upper layer pattern 210 overlaps the odd number groups of the lower layer pattern 110 and the even number groups of the upper layer pattern 210 overlaps the even number groups of the lower layer pattern 110. In some embodiments, the phase difference between the upper layer pattern 210 and the lower layer pattern 110 is zero, where the center of each of the odd number groups of the upper layer pattern 210 is designed to align with the center of each of the odd number groups of the lower layer pattern 110, and the center of each of the even number groups of the upper layer pattern 210 is designed to align with the center of each of the even number groups of the lower layer pattern 110. In other embodiments, the phase difference between the upper layer pattern 201 and the lower layer pattern 110 of the first and second groups (segments) is different from the phase difference between the upper layer pattern 201 and the lower layer pattern 110 of the third and fourth groups (segments).

Figure 4:
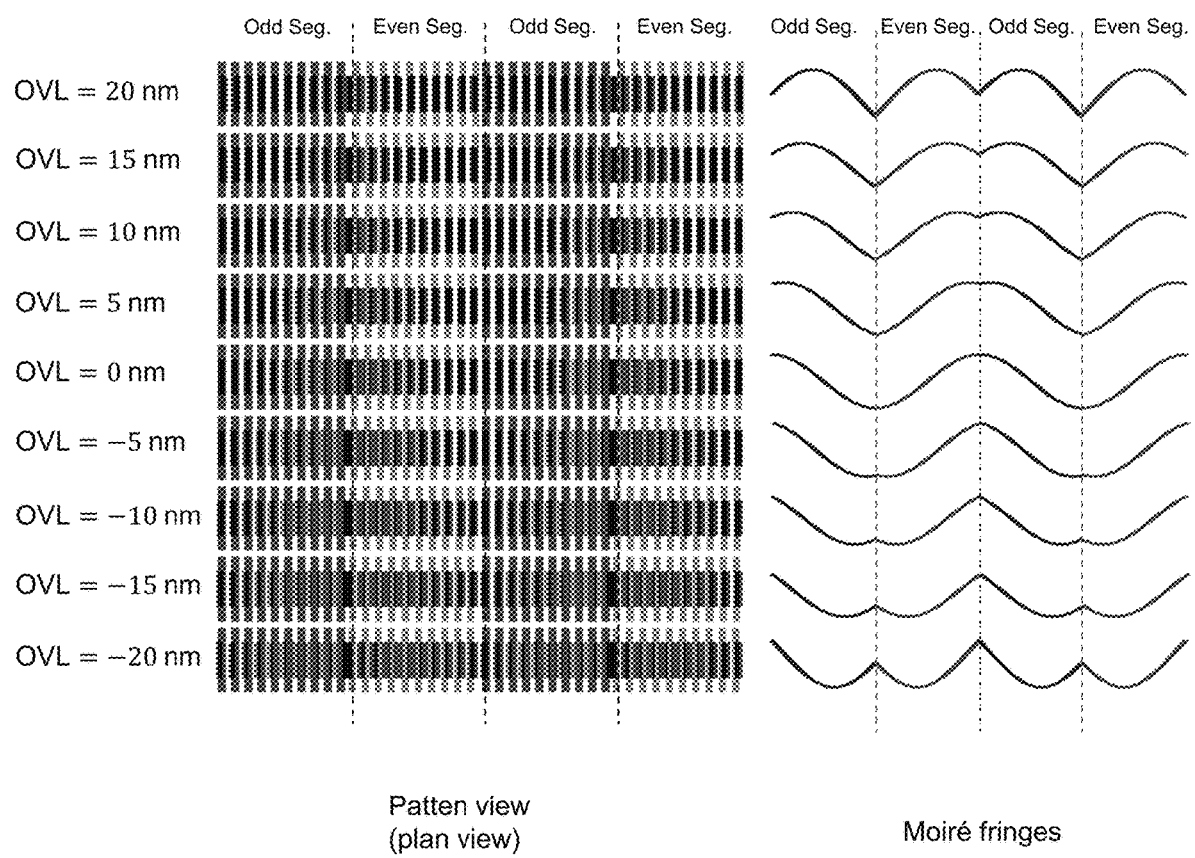
FIG. 4 shows relationships between overlay errors between the upper layer pattern and the lower layer pattern where the phase shift is zero and the Moiré fringe patterns according to an embodiment of the present disclosure.

FIG. 4 shows the relationship between overlay errors between the upper layer pattern and the lower layer pattern where the phase shift is zero and the Moiré fringe patterns. In FIG. 4, the first pitch P1 is 105 nm and the second pitch P2 is 100 nm and thus Λ=2100 nm.

As shown in FIG. 4, when there is an overlay error (mis-alignment) between the previous layer (lower layer) and the current layer (upper layer), the Moiré fringe patterns on the odd segments (groups) and the even segments (groups) are shifted to opposite directions because their previous/current layer pitch is exchanged. The measurement pattern set shown in FIGS. 3 and 4 can obtain the initial phase $\psi_0$ for overlay calculation. Because the pair of odd and even segments are imaged with the same starting pixel position of the axis perpendicular to Moiré fringes, their initial phase difference is the same as given by the mark design and can be eliminated.

The Moiré fringe pattern from the odd segments is represented by:

$$I_{odd} = \cos\left(\frac{2\pi}{\Lambda}x + \frac{2\pi \cdot OVL}{P1} + \psi_{odd} + \Delta\phi_i\right),$$

and
the Moiré fringe pattern from the even segments is represented by:

$$I_{even} = \cos\left(\frac{2\pi}{\Lambda}x - \frac{2\pi \cdot OVL}{P1} + \psi_{even} + \Delta\phi_i\right),$$

where $\psi_{odd}$ and $\psi_{even}$ represent the initial phases of the odd and even segments in the SEM image, respectively, and the difference $\Delta\psi = \psi_{odd} - \psi_{even}$.

From the SEM image, the Moiré fringe patterns of the odd and even segments are obtained as shown in FIG. 4, and each of the Moiré fringe patterns is analyzed by a curve fitting method to fit the formulas of $I_{odd}$ and $I_{even}$, respectively.

Since the initial phase difference $\Delta\psi$ is known or set by pattern design, $\phi_{odd}$ and $\phi_{even}$ are calculated as follows:

$$\frac{2\pi \cdot OVL}{P1} + \psi_{odd} = \phi_{odd}, -\frac{2\pi \cdot OVL}{P1} + \psi_{even} = \phi_{even}$$

Then, the overlay error OVL is calculated by:

$$OVL = \frac{P1}{4\pi}(\phi_{odd} - \phi_{even} - \Delta\psi).$$

In some embodiments, the overlay error is obtained by using an image comparison method. As shown in FIG. 4, the Moiré fringe patterns are uniquely obtained for different overlay errors.

In some embodiments, various overlay measurement pattern sets with different designed (known) overlay errors are formed over a substrate. In some embodiments, the overlay measurement pattern sets are formed over different substrates having different layer structures. Then, the Moiré fringe patterns for respective overlay measurement pattern sets for respective know overlay errors are obtained. The obtained Moiré fringe patterns are stored in association with the corresponding overlay errors. Such sets of the Moiré fringe patterns and the corresponding overlay errors (e.g., a database) are obtained for different layer structures including one or more of the materials of the upper layer patterns and the lower layer patterns, the material and thickness of the intermediate layer (e.g., the second intermediate layer 30), the material and thickness of the underlying layer (e.g., the first intermediate layer 20), and/or the structure of the upper layer pattern and the lower layer pattern.

In some embodiments, there is an actual overlay error caused by the manufacturing process between the upper layer pattern and the lower layer pattern. In such a case, the actual overlay error is measured by one or more other methods, for example, measurement by various optical methods, and the corresponding overlay errors are adjusted.

In some embodiments, in the actual measurement of an overlay error between the upper layer pattern and the lower layer patter, a Moiré fringe pattern is obtained by an SEM observation, and the obtained Moiré fringe pattern is compared with the stored (previously obtained) Moiré fringe patterns having the same measurement pattern configuration (material, thickness etc.). Then, the overlay error is obtained by finding the best matched Moiré fringe pattern having a known overlay error.

In some embodiments, a machine learning process is employed to learn the relationship between the Moiré fringe patterns and the corresponding overlay errors and to compare the Moiré fringe patterns.

Figure 5:
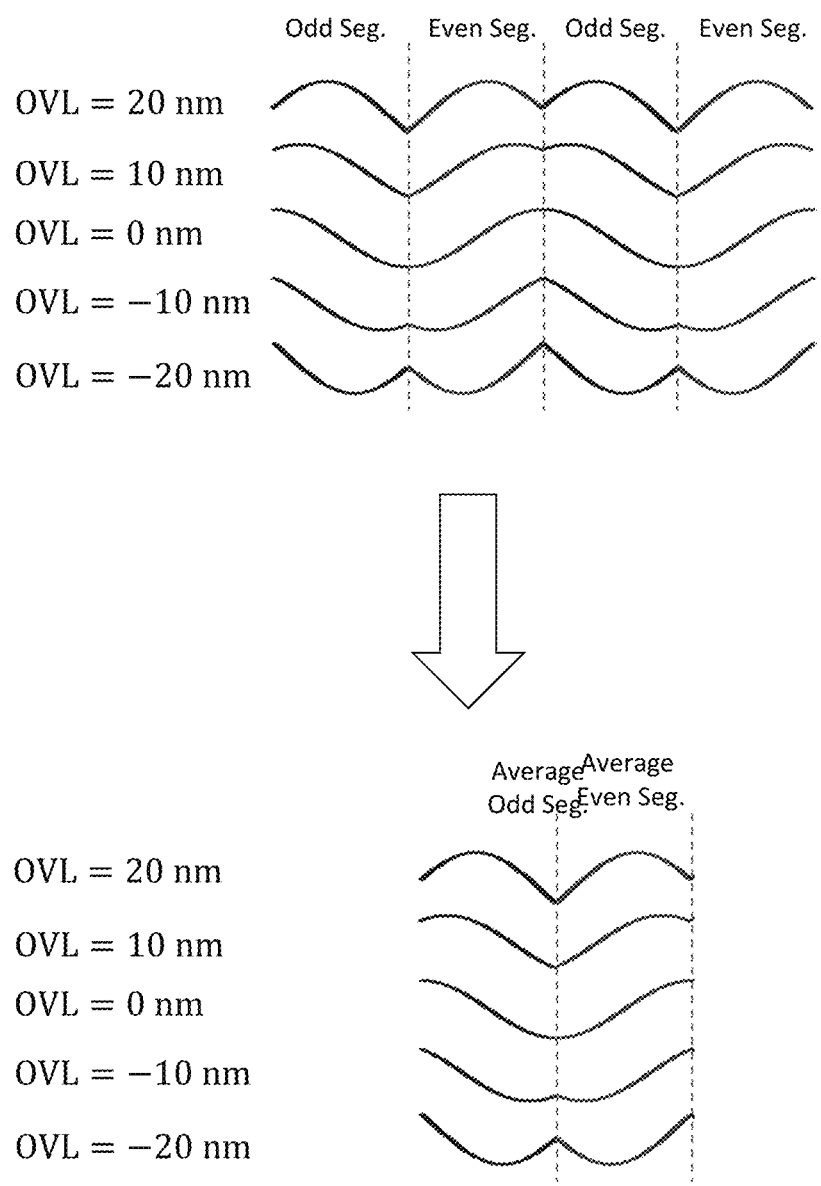
FIG. 5 shows Moiré fringe patterns according to an embodiment of the present disclosure.

In some embodiments, in the curve fitting, in the learning the Moiré fringe patterns and/or in the measuring the actual overlay error, one or more signal processing, such as smoothing, noise reduction, etc., are performed. When two or more sets of the odd and even segments are provided, the Moiré fringe patterns from the odd and even segments are averaged or superimposed, respectively, to obtain one set of the Moiré fringe patterns for the odd and even segments, as shown in FIG. 5.

Figure 6:
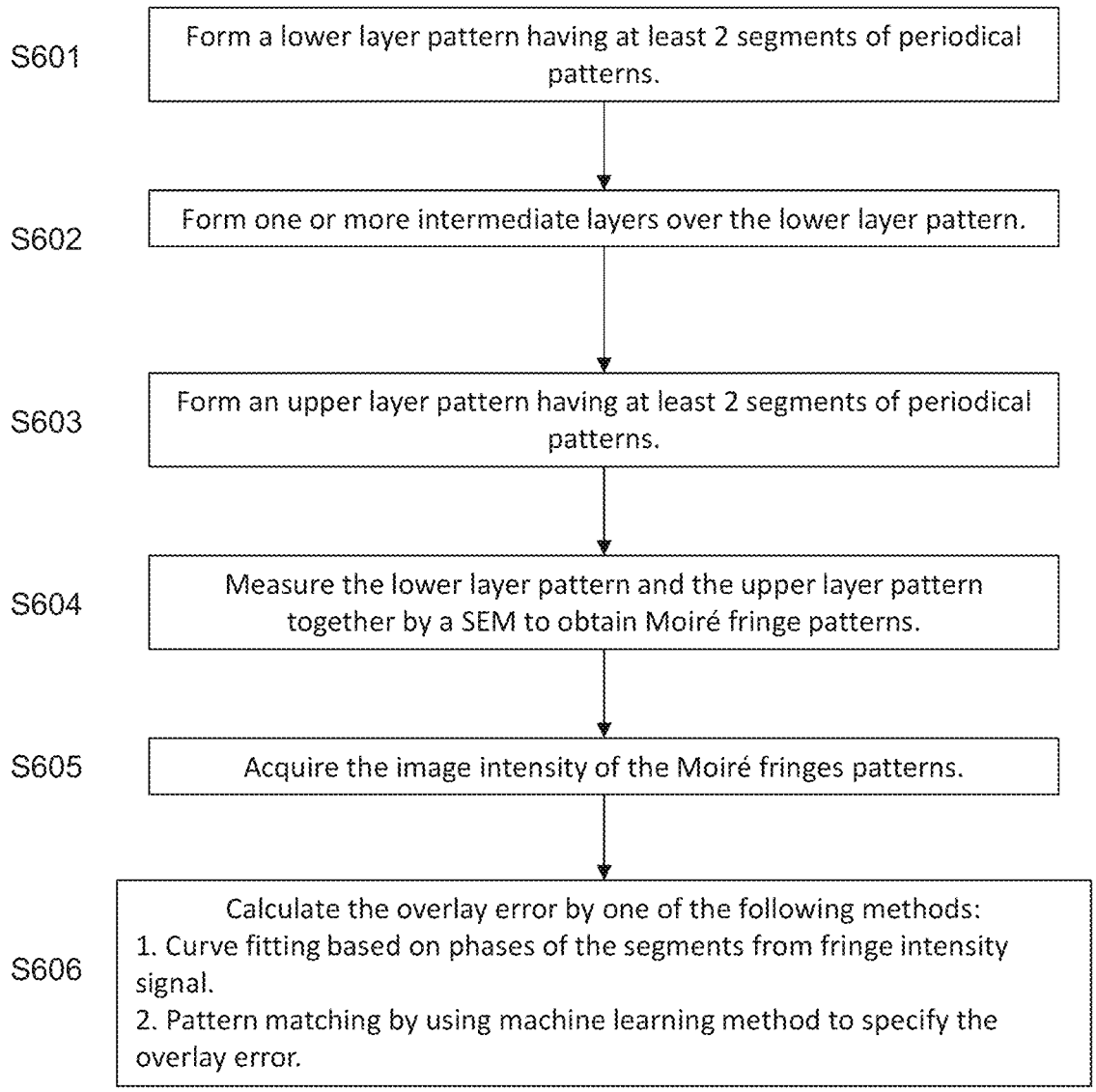
FIG. 6 is a flow of a sequential manufacturing process of a semiconductor device including an overlay measurement.

FIG. 6 is a flow of a sequential manufacturing process of a semiconductor device including an overlay measurement.

At S601, a lower layer pattern is formed over the substrate. In some embodiments, a first layout pattern that includes a circuit pattern and a lower layer pattern are imaged, e.g., projected, onto a wafer to create the first layout pattern as a photo resist pattern on the substrate or on one or more layers formed over the substrate. Then, the substrate or the one or more layers are patterned (e.g., etched) to form the circuit pattern and the lower layer pattern. In some embodiments, the etched pattern is filled by a metal material, a metallic material, a semiconductor material, and/or a dielectric material to form the circuit pattern and the lower layer pattern. In some embodiments, at least two segments or groups of periodic patterns are included in the lower layer pattern. Then, at S602, in some embodiments, the first layout pattern is covered with one or more intermediate layers, such as a dielectric layer. At S603, an upper layer pattern is formed over the intermediate layer. In some embodiments, a second layout pattern that includes a circuit pattern and an upper layer pattern are imaged to form a photo resist pattern on the intermediate layer. In some embodiments, the photo resist layer is used as the upper layer pattern in the overlay measurement. In other embodiments, one or more layers of the intermediate layer are patterned (e.g., etched) to form the circuit pattern and the upper layer pattern. In some embodiments, the etched pattern is filled by a metal material, a metallic material, a semiconductor material, and/or a dielectric material to form the circuit pattern and the upper layer pattern. In some embodiments, at least two segments or groups of periodic patterns are included in the upper layer pattern At S604, the substrate with the lower layer pattern and the upper layer pattern formed is loaded into an SEM apparatus, and the lower layer pattern and the upper layer pattern are irradiated and scanned with an electron beam of the SEM apparatus. In some embodiments, the acceleration voltage of the electron beam is adjusted according to the layer structure. At S605, the Moiré fringe patterns are acquired as an intensity of secondary electrons and back scattered electros.

Then, at S606, an overlay error between the first layout pattern including the lower layer pattern and the second layout pattern including the upper layer pattern is calculated or acquired by one of the curve fitting method and the pattern matching method as explained above.

FIGS. 7A-7D show cross sectional views of the overlay measurement pattern sets according to various embodiments of the present disclosure. Configurations, dimensions, methods, and material as explained with respect to FIGS. 1A-6 are applicable to the following embodiments, and the detailed description thereof may be omitted.

Figure 7A:
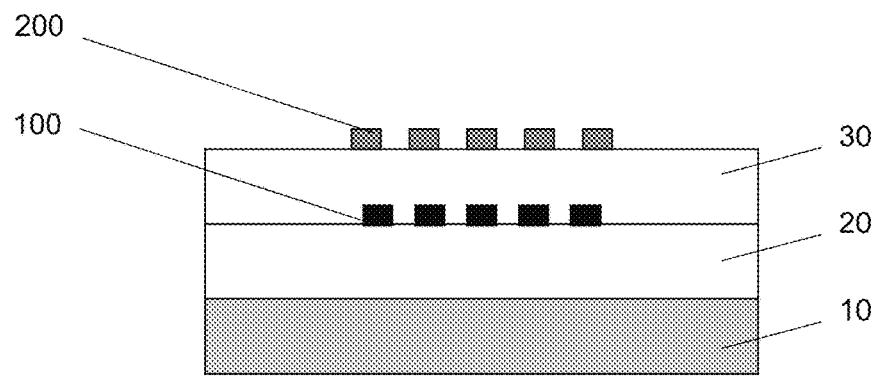
FIGS. 7A, 7B, 7C and 7D show cross sectional views of the overlay measurement pattern sets according to various embodiments of the present disclosure.

In FIG. 7A, the lower layer pattern 100 (or 110 shown in FIG. 3) is made of a different material than the first intermediate layer 20 and formed on the upper surface of the first intermediate layer 20. In some embodiments, the first intermediate layer 20 is made of a dielectric material and the lower layer pattern 100 is made of a conductive material, such as metal or a metal alloy. The second intermediate layer 30 covers the lower layer pattern 100 and the upper layer pattern 200 (or 210 shown in FIG. 3) is formed on the surface of the second intermediate layer 30 in some embodiments. In some embodiments, the upper layer pattern 200 is made of a photo resist material, such as a single layer resist or a multi-layer resist. In such a case, the overlay measurement is performed after the photolithography operation (resist development) and before an etching operation. In other embodiments, the upper layer pattern 200 is made of a dielectric material, a metal material, a metallic (metal alloy) material and/or a semiconductor material different from the second intermediate layer 30 and formed by an etching operation.

Figure 7B:
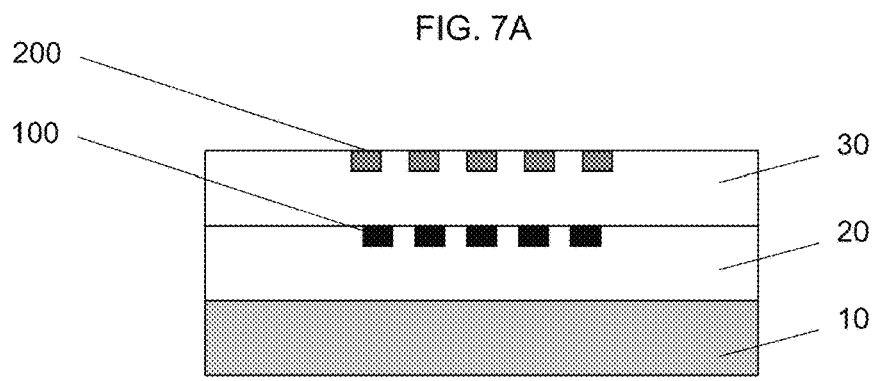

In FIG. 7B, the lower layer pattern 100 (or 110) is embedded in the surface region of the first intermediate layer 20 and the upper layer pattern 200 (or 210) is also embedded in the surface region of the second intermediate layer 30. The material of the lower layer pattern 100 is different from the first intermediate layer 20, and the material of the upper layer pattern 200 is different from the second intermediate layer 30, in some embodiments. The material of the lower layer pattern 100 is the same as or different from the upper layer pattern 200 in some embodiments.

Figure 7C:
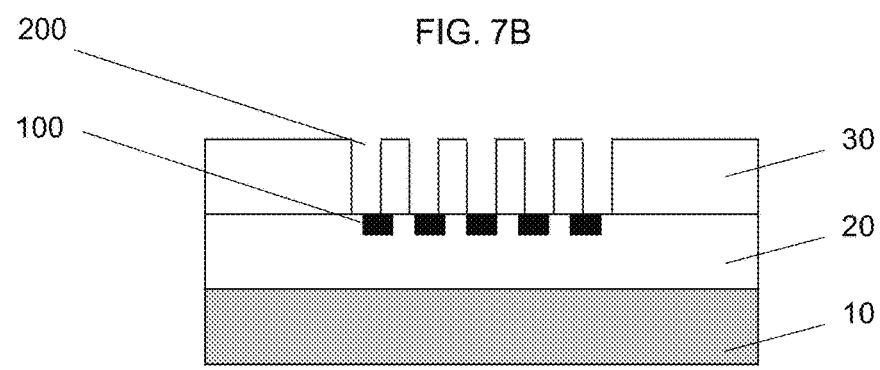

In FIG. 7C, the upper layer pattern 200 is an etched pattern, such as trenches or openings, formed in the second intermediate layer 30. In some embodiments, the trenches or openings reach the first intermediate layer 20 and/or the lower layer pattern 100, and in other embodiments, the trenches or openings does not reach the first intermediate layer 20 and/or the lower layer pattern 100.

Figure 7D:
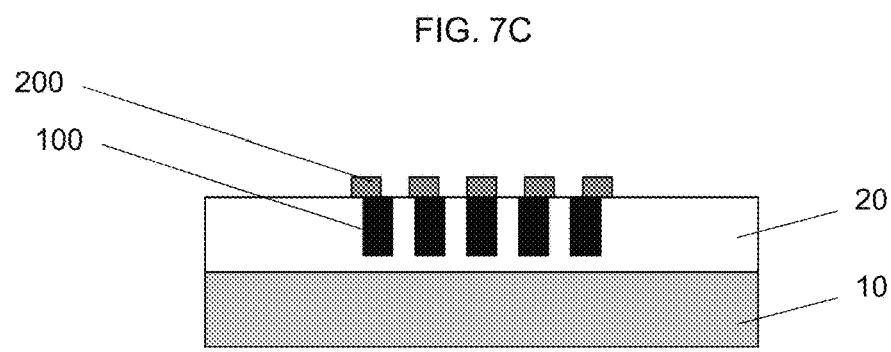

In FIG. 7D, no second intermediate layer is formed, and the upper layer pattern 200 is directly formed on the first intermediate layer 20 and/or the lower layer pattern 100. In some embodiments, the upper layer pattern 200 is made of a photo resist material, and in other embodiments, the upper layer pattern 200 is made of a dielectric material, a metal material, a metallic (metal alloy) material and/or a semiconductor material different from the second intermediate layer 30 and formed by an etching operation.

The entirety or one or more parts of the configurations, dimensions, methods, and material of one structure of FIGS. 7A-7D are applicable to other structures of FIGS. 7A-7D. For example, the lower layer structure of FIG. 7A can be combined with the upper layer structure shown in FIGS. 7B, 7C and/or 7D.

Figure 8:
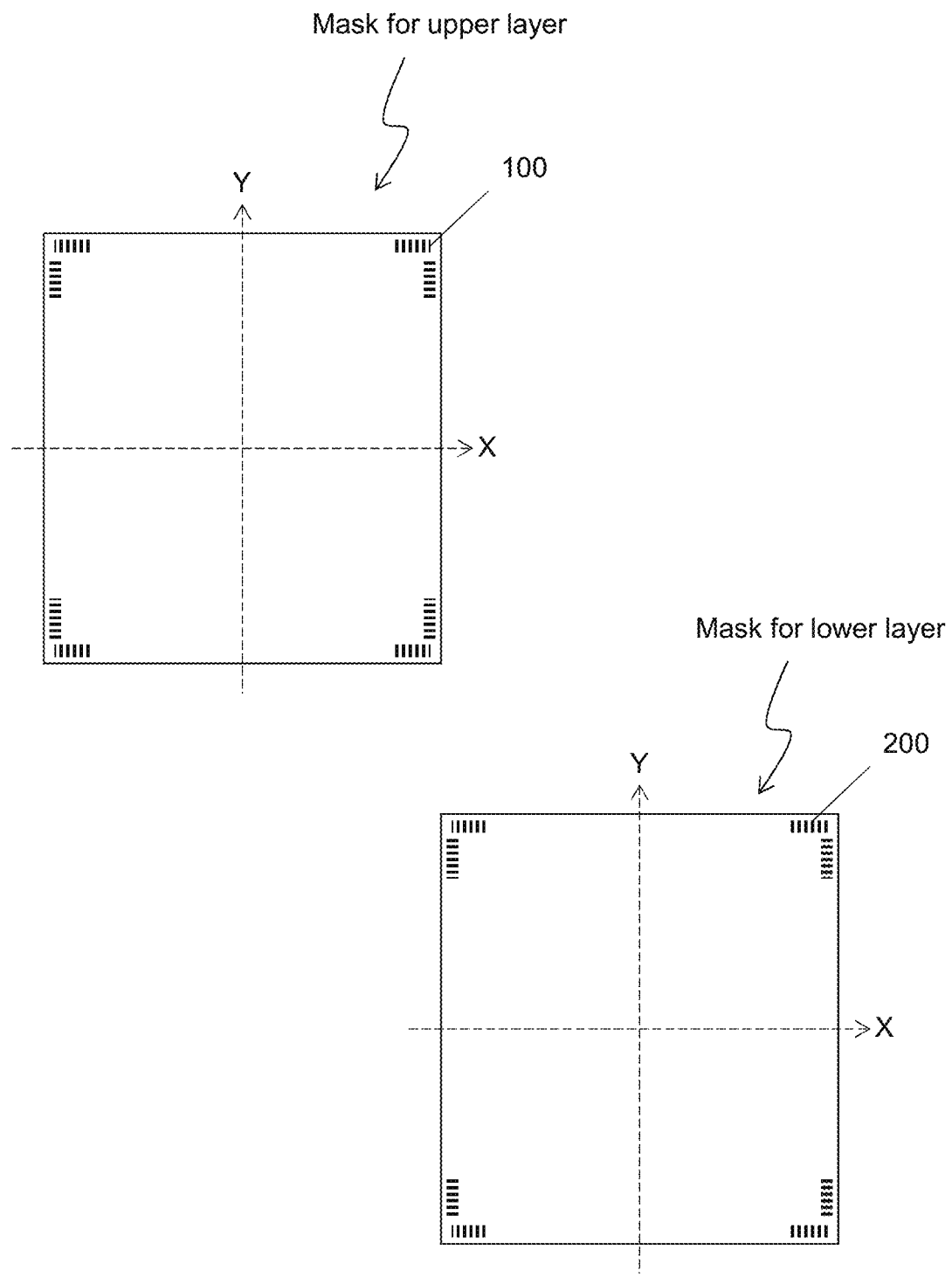
FIG. 8 shows a layout of the overlay measurement pattern on a photo mask or a photo mask set according to an embodiment of the present disclosure.

FIG. 8 shows a layout of the overlay measurement pattern on a photo mask or a photo mask set. The overlay measurement pattern for the lower layer pattern 100 or 110 as set forth above is formed on a photo mask for the lower layer and the overlay measurement pattern for the upper lower layer pattern 200 or 210 as set forth above is formed on a photo mask for the upper layer, respectively. In some embodiments, sets of the overlay measurement pattern for measuring the X direction overlay error and for measuring the Y direction overlay error are placed on four corners of the photo mask. In some embodiments, the sets of the overlay measurement patterns are placed on scribe lines disposed between chip patterns. When multiple chip patterns are disposed in one photo mask (one exposure area), more than four sets of the overlay measurement patterns are placed on the photo mask.

In some embodiment, the X-Y coordinates of the center of the lower layer pattern on the photo mask is the same as the X-Y coordinates of the center of the upper layer pattern on the photo mask (no phase shift, or co-axial patterns).

The overlay measurement patterns are also applicable to an optical measurement method. Similar to an electron beam measurement, the upper layer pattern and the lower layer pattern are irradiated by a light beam (e.g., a coherent light, such as a laser light) to obtain Moiré fringe patterns. Then, the obtained Moiré fringe patterns are analyzed to obtain the overlay error using the curve fitting method and/or the pattern matching method as set forth above.

In the foregoing embodiments, an SEM-based overlay measurement pattern set includes a small pitch difference between the lower (previous) pattern and the upper (current) layer, and the overlay error can be calculated by the phase of Moiré fringe patterns, which are obtained from the previous layer image (mainly by back scattered electrons) transparently merged to the current layer image (mainly by secondary electrons), on the measurement patterns. In some embodiments, multiple segments of the measurement pattern sets are provided, which can eliminate a non-coaxial phase error. With these measurement patterns and method, it is possible to more accurately measure an overlay error using an SEM, and to increase a speed of an SEM-based overlay measurement.

It will be understood that not all advantages have been necessarily discussed herein, no particular advantage is required for all embodiments or examples, and other embodiments or examples may offer different advantages.

According to an aspect of the present disclosure, in a method of manufacturing a semiconductor device, a lower layer pattern including first periodic patterns having a first pitch is formed, and an upper layer pattern including second periodic patterns having a second pitch different from the first pitch is formed. The first periodic patterns at least partially overlaps the second periodic patterns in plan view. A Moiré fringe pattern of the lower layer pattern and the upper layer pattern is obtained by using an electron beam, and an overlay error between the lower layer pattern and the upper layer pattern is obtained from the Moiré fringe pattern. In one or more of the foregoing and following embodiments, a different between the first pitch and the second pitch is in a range from 2 nm to 10 nm. In one or more of the foregoing and following embodiments, each of the first pitch and the second pitch is in a range from 20 nm to 200 nm. In one or more of the foregoing and following embodiments, a width of each of the first periodic patterns and each of the second periodic patterns is in a range from 10 nm to 100 nm. In one or more of the foregoing and following embodiments, a length of each of the first periodic patterns is different from a length of each of the second periodic patterns. In one or more of the foregoing and following embodiments, when the Moiré fringe pattern is obtained, secondary electrons from the upper layer pattern and back scattered electrons from the lower layer patterns are obtained.

According to another aspect of the present disclosure, in a method of manufacturing a semiconductor device, a lower layer pattern including lower N groups of periodic patterns is formed. The lower N groups are arranged along a first direction, one or more odd number groups of the lower N groups include first periodic patterns having a first pitch and one or more even number groups of the lower N groups include second periodic patterns having a second pitch. N is a natural number of 2 or more. An upper layer pattern including upper N groups of periodic patterns is formed. The upper N groups are arranged along the first direction, one or more odd number groups of the upper N groups include third periodic patterns having the second pitch and one or more even number groups of the upper N groups include fourth periodic patterns having the first pitch, and the third periodic patterns at least partially overlaps the first periodic pattern and the fourth periodic patterns at least partially overlaps the second periodic pattern in plan view. A Moiré fringe pattern of the lower layer pattern and the upper layer pattern is obtained by using an electron beam, and an overlay error between the lower layer pattern and the upper layer pattern is obtained from the Moiré fringe pattern. In one or more of the foregoing and following embodiments, the overlay error is obtained by using a curve fitting method of the Moiré fringe pattern. In one or more of the foregoing and following embodiments, in the curve fitting method, the Moiré fringe pattern from the one or more odd number groups of the lower N groups and the one or more odd number groups of the upper N groups is fitted to:

$$I_{odd} = \cos\left(\frac{2\pi}{\Lambda}x + \frac{2\pi \cdot OVL}{P1} + \psi_{odd} + \Delta\phi_i\right),$$

the Moiré fringe pattern from the one or more even number groups of the lower N groups and the one or more even number groups of the upper N groups is fitted to:

$$I_{even} = \cos\left(\frac{2\pi}{\Lambda}x - \frac{2\pi \cdot OVL}{P1} + \psi_{even} + \Delta\phi_i\right),$$

and
the overlay error is obtained by:

$$OVL = \frac{P1}{4\pi}(\phi_{odd} - \phi_{even} - \Delta\psi),$$

where P1 is the first pitch, P2 is the second pitch, $$\Lambda = \frac{P_1 \times P_2}{|P_1 - P_2|}, \phi_{odd} = \frac{2\pi \cdot OVL}{P1} + \psi_{odd},$$

$$\phi_{even} = -\frac{2\pi \cdot OVL}{P1} + \psi_{even},$$

$\Delta\phi_i$ is a phase shift, and $\Delta\psi$ is an initial phase difference determined from the lower layout pattern and the upper layout pattern. In one or more of the foregoing and following embodiments, the overlay error is obtained by using a machine learning method to obtain a most similar Moiré fringe pattern with a known overlay error. In one or more of the foregoing and following embodiments, a different between the first pitch and the second pitch is in a range from 1 nm to 20 nm. In one or more of the foregoing and following embodiments, each of the first pitch and the second pitch is in a range from 50 nm to 100 nm. In one or more of the foregoing and following embodiments, a width of each of the first periodic patterns and each of the second periodic patterns is in a range from 10 nm to 100 nm. In one or more of the foregoing and following embodiments, a length of each of the first periodic patterns is different from a length of each of the third periodic patterns. In one or more of the foregoing and following embodiments, in the obtaining the Moiré fringe pattern, secondary electrons from the upper layer pattern and back scattered electrons from the lower layer patterns are obtained. In one or more of the foregoing and following embodiments, N is 4. In one or more of the foregoing and following embodiments, one or more layers are formed over the lower layer pattern, and when the upper layer pattern is formed, one or more etching operations are performed. In one or more of the foregoing and following embodiments, the lower layer pattern include metal or a metal alloy, and the upper layer pattern s formed by a dielectric material.

According to another aspect of the present disclosure, a semiconductor device includes a lower layer pattern including lower N groups of periodic patterns, one or more intermediate layers disposed over the lower layer pattern and an upper layer pattern including upper N groups of periodic patterns. The lower N groups are arranged along a first direction, one or more odd number groups of the lower N groups includes first periodic patterns having a first pitch and one or more even number groups of the lower N groups includes second periodic patterns having a second pitch, where N is a natural number of 2 or more. The upper N groups are arranged along the first direction, one or more odd number groups of the upper N groups includes third periodic patterns having the second pitch and one or more even number groups of the upper N groups includes fourth periodic patterns having the first pitch, and the third periodic patterns at least partially overlaps the first periodic pattern and the fourth periodic patterns at least partially overlaps the second periodic pattern in plan view. In one or more of the foregoing and following embodiments, N is 2 or 4.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of determining an overlay alignment of a semiconductor device, comprising:
    forming a lower layer pattern of the semiconductor device comprising first periodic patterns having a first pitch;
    forming an upper layer pattern of the semiconductor device comprising second periodic patterns having a second pitch different from the first pitch, wherein the first periodic patterns at least partially overlap the second periodic patterns in plan view;
    obtaining a Moiré fringe pattern of the lower layer pattern and the upper layer pattern by using an electron beam, wherein the obtaining the Moiré fringe, pattern uses the detection of secondary electrons from the upper layer pattern and back scattered electrons from the lower layer pattern; and
    obtaining the overlay error between the lower layer pattern and the upper layer pattern from the Moiré fringe pattern.

2. The method of claim 1, wherein a difference between the first pitch and the second pitch is in a range from 2 nm to 10 nm.

3. The method of claim 1, wherein each of the first pitch and the second pitch is in a range from 20 nm to 200 nm.

4. The method of claim 1, wherein a line width of each of the first periodic patterns and each of the second periodic patterns is in a range from 10 nm to 100 nm.

5. The method of claim 4, wherein a line length of each of the first periodic patterns is different from a line length of each of the second periodic patterns.

6. A method of determining an overlay alignment of a semiconductor device, comprising:
    forming a lower layer pattern of the semiconductor device comprising lower N groups of periodic patterns, wherein the lower N groups are arranged along a first direction, one or more odd number groups of the lower N groups include first periodic patterns having a first pitch and one or more even number groups of the lower N groups include second periodic patterns having a second pitch different from the first pitch, where N is a natural number of 2 or more;

forming an upper layer pattern of the semiconductor device comprising upper N groups of periodic patterns, wherein the upper N groups are arranged along the first direction, one or more odd number groups of the upper N groups include third periodic patterns having the second pitch and one or more even number groups of the upper N groups include fourth periodic patterns having the first pitch, and the third periodic patterns at least partially overlap the first periodic patterns and the fourth periodic patterns at least partially overlap the second periodic patterns in plan view;

obtaining a Moiré fringe pattern of the lower layer pattern and the upper layer pattern by using an electron beam, wherein the obtaining the Moiré fringe, pattern uses the detection of secondary electrons from the upper layer pattern and back scattered electrons from the lower layer pattern; and obtaining the overlay error between the lower layer pattern and the upper layer pattern from the Moiré fringe pattern.

7. The method of claim 6, wherein the overlay error is obtained by using a curve fitting method of the Moiré fringe pattern.

8. The method of claim 7, wherein in the curve fitting method, the Moiré fringe pattern from the one or more odd number groups of the lower N groups and the one or more odd number groups of the upper N groups is fitted to:

$$I_{odd} = \cos\left(\frac{2\pi}{\Lambda}x + \frac{2\pi \cdot OVL}{P1} + \psi_{odd} + \Delta\phi_i\right),$$

the Moiré fringe pattern from the one or more even number groups of the lower N groups and the one or more even number groups of the upper N groups is fitted to:

$$I_{even} = \cos\left(\frac{2\pi}{\Lambda}x - \frac{2\pi \cdot OVL}{P1} + \psi_{even} + \Delta\phi_i\right),$$

and
the overlay error is obtained by:

$$OVL = \frac{P1}{4\pi}(\phi_{odd} - \phi_{even} - \Delta\psi),$$

where P1 is the first pitch, P2 is the second pitch, $$\Lambda = \frac{P_1 \times P_2}{|P_1 - P_2|}, \phi_{odd} = \frac{2\pi \cdot OVL}{P1} + \psi_{odd},$$

$$\phi_{even} = -\frac{2\pi \cdot OVL}{P1} + \psi_{even},$$

$\Delta\phi_i$ is a phase shift, and $\Delta\psi$ is an initial phase difference determined from the lower layer pattern and the upper layer pattern.

9. The method of claim 6, wherein the overlay error is obtained by using a machine learning method to obtain a most similar Moiré fringe pattern with a known overlay error.

10. The method of claim 6, wherein a difference between the first pitch and the second pitch is in a range from 1 nm to 20 nm.

11. The method of claim 6, wherein each of the first pitch and the second pitch is in a range from 50 nm to 100 nm.

12. The method of claim 6, wherein a line width of each of the first periodic patterns and each of the second periodic patterns is in a range from 10 nm to 100 nm.

13. The method of claim 12, wherein a line length of each of the first periodic patterns is different from a line length of each of the third periodic patterns.

14. The method of claim 6, wherein N is 4.

15. The method of claim 6, further comprising forming one or more layers over the lower layer pattern,
wherein the forming the upper layer pattern comprises one or more etching operations.

16. The method of claim 15, wherein the lower layer pattern includes metal or a metal alloy, and the upper layer pattern is formed by a dielectric material.

17. A method of determining a mis-alignment value for a semiconductor device, comprising:

forming a lower layer pattern of the semiconductor device comprising first periodic patterns having a first pitch;

forming an upper layer pattern of the semiconductor device comprising second periodic patterns having a second pitch different from the first pitch, wherein the first periodic patterns at least partially overlap the second periodic patterns in plan view, wherein a line length of each of the first periodic patterns is different from a line length of each of the second periodic patterns;

irradiating an electron beam to the upper layer pattern and the lower layer pattern;

obtaining a Moiré fringe pattern of the lower layer pattern and the upper layer pattern based on-detected detection of secondary electrons from the upper layer pattern and back scattered electrons from the lower layer pattern; and obtaining the mis-alignment value between the lower layer pattern and the upper layer pattern from the Moiré fringe pattern.

18. The method of claim 17, wherein a difference between the first pitch and the second pitch is in a range from 2 nm to 10 nm.

19. The method of claim 17, wherein a line width of each of the first periodic patterns and each of the second periodic patterns is in a range from 10 nm to 100 nm.

20. The method of claim 17, wherein a line length of each of the first periodic patterns is different from a length of each of the second periodic patterns.

* * * * *